United States Patent
Nagai et al.

(10) Patent No.: US 11,837,488 B2
(45) Date of Patent: Dec. 5, 2023

(54) COMPOSITE SINTERED BODY, SEMICONDUCTOR MANUFACTURING APPARATUS MEMBER, AND METHOD OF MANUFACTURING COMPOSITE SINTERED BODY

(71) Applicant: NGK INSULATORS, LTD., Nagoya (JP)

(72) Inventors: Asumi Nagai, Nagoya (JP); Katsuhiro Inoue, Nagoya (JP); Yuji Katsuda, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 719 days.

(21) Appl. No.: 16/934,222

(22) Filed: Jul. 21, 2020

(65) Prior Publication Data

US 2020/0350196 A1 Nov. 5, 2020

Related U.S. Application Data

(63) Continuation of application No. PCT/JP2019/005853, filed on Feb. 18, 2019.

(30) Foreign Application Priority Data

Feb. 20, 2018 (WO) ................. PCT/JP2018/005952

(51) Int. Cl.
| | |
|---|---|
| *H01T 23/00* | (2006.01) |
| *H01L 21/683* | (2006.01) |
| *B28B 1/00* | (2006.01) |
| *C04B 35/117* | (2006.01) |
| *C04B 35/565* | (2006.01) |

(52) U.S. Cl.
CPC .......... *H01L 21/6833* (2013.01); *B28B 1/001* (2013.01); *C04B 35/117* (2013.01); *C04B 35/565* (2013.01)

(58) Field of Classification Search
None
See application file for complete search history.

(56) References Cited

U.S. PATENT DOCUMENTS

| 4,692,418 A | * | 9/1987 | Boecker | ................ C04B 35/565 |
| | | | | 501/88 |
| 5,217,932 A | * | 6/1993 | Furuse | ................ C04B 35/597 |
| | | | | 501/88 |

(Continued)

FOREIGN PATENT DOCUMENTS

| JP | H08-169755 A | 7/1996 |
| JP | 2000-034174 A1 | 2/2000 |

(Continued)

OTHER PUBLICATIONS

Chinese Office Action (Application No. 201980011750.X) dated Mar. 21, 2022.

(Continued)

*Primary Examiner* — Stephen W Jackson
(74) *Attorney, Agent, or Firm* — BURR PATENT LAW, PLLC (57) ABSTRACT

A method of manufacturing a composite sintered body includes a step (Step S11) of molding mixed powder in which $Al_2O_3$, SiC, and MgO are mixed, into a green body having a predetermined shape and a step (Step S12) of generating a composite sintered body by sintering the green body. Then, in Step S11, the ratio of SiC to the mixed powder is not lower than 4.0 weight percentage and not higher than 13.0 weight percentage. Further, the purity of $Al_2O_3$ in Step S11 is not lower than 99.9%. It is thereby possible to suppress the abnormal grain growth of $Al_2O_3$ and suitably manufacture a composite sintered body having high relative dielectric constant and withstand voltage, and low tan δ.

19 Claims, 6 Drawing Sheets

(56) References Cited

U.S. PATENT DOCUMENTS

| | | | | |
|---|---|---|---|---|
| 5,322,824 | A | * | 6/1994 | Chia .................... C04B 35/565 |
| | | | | 252/516 |
| 6,706,428 | B2 | * | 3/2004 | Kobayashi ............. C04B 35/10 |
| | | | | 428/307.3 |
| 2002/0006678 | A1 | | 1/2002 | Inazumachi et al. |
| 2010/0248935 | A1 | | 9/2010 | Teratani et al. |
| 2014/0287245 | A1 | | 9/2014 | Jindo et al. |
| 2015/0340121 | A1 | | 11/2015 | Ootomo et al. |
| 2017/0057875 | A1 | | 3/2017 | Ishizuka et al. |
| 2019/0043746 | A1 | | 2/2019 | Yoshioka et al. |
| 2021/0257243 | A1 | * | 8/2021 | Ono ....................... C04B 35/645 |

FOREIGN PATENT DOCUMENTS

| | | |
|---|---|---|
| JP | 2001-287982 A1 | 10/2001 |
| JP | 2006-193353 A1 | 7/2006 |
| JP | 5501040 B2 | 5/2014 |
| JP | 6032022 B2 | 11/2016 |
| JP | 6103046 B2 | 3/2017 |
| TW | 201506000 A | 2/2015 |
| WO | 2017/131159 A1 | 8/2017 |

OTHER PUBLICATIONS

International Search Report and Written Opinion (Application No. PCT/JP2019/005853) dated Apr. 23, 2019.
Chinese Office Action (Application No. 201980011750.X) dated Nov. 18, 2021.
English translation of International Preliminary Report on Patentability (Chapter I) (Application No. PCT/JP2019/005853) dated Sep. 3, 2020, 14 pages.
Taiwanese Office Action (Application No. 108105244) dated Mar. 15, 2021.

* cited by examiner

COMPOSITE SINTERED BODY, SEMICONDUCTOR MANUFACTURING APPARATUS MEMBER, AND METHOD OF MANUFACTURING COMPOSITE SINTERED BODY

CROSS REFERENCE TO RELATED APPLICATION

The present application claims priority to International Patent Application PCT/JP 2019/005853 filed on Feb. 18, 2019, the content of which is incorporated herein by reference in its entirety.

TECHNICAL FIELD

The present invention relates to a composite sintered body, a semiconductor manufacturing apparatus member, and a method of manufacturing a composite sintered body.

BACKGROUND ART

In an apparatus of manufacturing a semiconductor substrate or the like, conventionally, used is a susceptor such as an electrostatic chuck which holds a semiconductor substrate by adsorption using the Coulomb force or the Johnsen-Rahbek force, a heater which increases the temperature of a semiconductor substrate, an electrostatic chuck heater combining the electrostatic chuck and the heater, or the like. The electrostatic chuck includes a main body having a substantially disk-like shape, on which a semiconductor substrate is placed, and an internal electrode buried inside the main body. In the electrostatic chuck, by applying a direct-current voltage between the internal electrode and the semiconductor substrate, a portion of the main body between the internal electrode and the semiconductor substrate serves as a dielectric layer, and the semiconductor substrate is thereby adsorbed to the main body.

Patent Publication No. 6032022 (Document 1) and Patent Publication No. 6103046 (Document 2) disclose a dielectric material for an electrostatic chuck, which is formed of a composite sintered body in which conductive particles each having a small particle diameter are dispersed in an insulating material. As the insulating material, $Al_2O_3$ or the like is used, and as the conductive particles, SiC or the like is used. The SiC particles used for manufacturing the dielectric material in Document 1 includes SiC particles each having a particle diameter of 0.05 μm or smaller in an amount from 50 weight percentage to 100 weight percentage. Further, the SiC particles used for manufacturing the dielectric material in Document 2 includes SiC particles each having a particle diameter of 0.05 μm or smaller in an amount from 67 weight percentage to 75 weight percentage.

On the other hand, Patent Publication No. 5501040 (Document 3) discloses a technique for hot-press sintering of mixed powder of $Al_2O_3$ with $MgF_2$, as a method of manufacturing an alumina sintered body to be used for an electrostatic chuck or the like.

Further, Japanese Patent Application Laid Open Gazette No. 2006-193353 (Document 4) proposes an $Al_2O_3$ sintered body which contains SiC particles having an average particle diameter from 0.5 μm to 2 μm in an amount of 5 to 35 weight percentage and contains Mg at 0.05 weight percentage or lower in terms of oxide, as an $Al_2O_3$ sintered body used for a cutting tool.

Paragraph [0030] of Japanese Patent Application Laid Open Gazette No. 2000-34174 (Document 5) proposes an $Al_2O_3$—SiC composite material in which MgO is added as a sintering aid. As described in claim 1, Paragraph [0011], and the like, oxide layers are provided on surfaces of SiC particles and a liquid phase is formed by the reaction of the oxide layer with $Al_2O_3$ particles, to thereby promote the sintering.

A semiconductor manufacturing apparatus member such as the electrostatic chuck or the like requires high corrosion resistance against a halogen-based corrosive gas and plasma of the corrosive gas. In the dielectric material disclosed in Documents 1 and 2, however, since the particle diameter of SiC having relatively low corrosion resistance is small and the particle diameter of $Al_2O_3$ is also small, unevenness in a surface of the electrostatic chuck becomes prominent with corrosion and fall-off of SiC and this causes further fall-off of particles, and therefore there is a possibility that the amount of corrosion per unit time may increase. Further, there is also a possibility that the $Al_2O_3$ particles may be desorbed from the electrostatic chuck during adsorption of the semiconductor substrate or the like, to thereby generate undesired particles.

Furthermore, in recent years, in the manufacture of a multilayer 3D NAND or the like, for high-aspect-ratio micromachining, used is a high-power and high-speed etching apparatus. A material of an electrostatic chuck used in the etching apparatus requires low RF loss, high dielectric constant, and less occurrence of dielectric breakdown. Further, in order to suppress heat generation in application of RF, low tan δ (i.e., dielectric loss tangent) is also required.

On the other hand, in the dielectric material disclosed in Document 2, tan δ at a frequency of 40 Hz is 0.018 to 0.042 and tan δ at a frequency of 1 MHz is 0.0034 to 0.0062, and the withstand voltage of the dielectric material disclosed in Documents 1 and 2 is 16 kV/mm or lower. The tan δ of the material is not low, and there is a possibility of generating heat due to the high-frequency (RF) environment. Further, the value of the withstand voltage is not sufficiently high, and when the dielectric material is used for the electrostatic chuck of the above-described etching apparatus, there is a possibility of causing dielectric breakdown. Since the SiC particles are fine and highly dispersed in the dielectric material, the SiC particles are easy to become a conductive path, and it is difficult to increase the withstand voltage. Furthermore, since the SiC particles are fine, it is estimated that the sinterability of the dielectric material is reduced, and it is thought that closed pores which are thereby generated also make it difficult to reduce the tan δ and increase the withstand voltage. In order to suppress the heat generation of ceramics in the application of RF, the tan δ is preferably not higher than 0.01, and more preferably not higher than 0.005. Further, the withstand voltage is preferably not lower than 25 kV/mm, and more preferably not lower than 30 kV/mm.

Further, in Document 4, it is thought from descriptions in Paragraph [0019] and Table 1, or the like, that a commercially-available easily sinterable $Al_2O_3$ raw material in which MgO is added in advance is used. The easily sinterable alumina raw material contains a lot of impurities such as sodium (Na) and the like (for example, several hundreds ppm or more), and an amorphous phase is generated due to the impurities in a grain boundary of a sintered body. In the sintered body, Mg or the like which is added as a sintering aid is easy to be taken in the amorphous phase, and a compound derived from Mg or the like is amorphized, not having a crystal structure, in the grain boundary. This is obvious from description in Paragraph [0010] of Document 4, that when the content percentage of Mg exceeds 0.05 weight percentage, a low-melting magnesium compound is formed in the grain boundary of $Al_2O_3$ or the like and the high temperature strength of the sintered body is reduced. Therefore, there is a limit to suppression of abnormal grain growth of $Al_2O_3$ (i.e., suppression of coarsening of sintered particle diameter).

Similarly in Document 5, Mg or the like which is added as a sintering aid is taken in the liquid phase (i.e., the amorphous phase) formed by the reaction of the surface oxide layers of the SiC particles with $Al_2O_3$ particles. For this reason, the compound derived from Mg or the like is amorphized, not having a crystal structure, in the grain boundary of the sintered body. Therefore, there is a limit to suppression of the abnormal grain growth of $Al_2O_3$.

SUMMARY OF INVENTION

The present invention is intended for a composite sintered body, and it is an object of the present invention to suppress the abnormal grain growth of aluminum oxide and provide a composite sintered body having high relative dielectric constant and withstand voltage, and low tan δ.

The composite sintered body according to one preferred embodiment of the present invention includes aluminum oxide, silicon carbide, and magnesium-aluminum composite oxide having a spinel-type crystal structure. The silicon carbide includes β-type silicon carbide. As to the particle diameter of the silicon carbide, D50 is not smaller than 0.7 µm. The ratio of carbon in the silicon carbide to the composite sintered body is not lower than 1.0 weight percentage and not higher than 4.0 weight percentage. By the present invention, it is possible to suppress the abnormal grain growth of aluminum oxide and provide a composite sintered body having high relative dielectric constant and withstand voltage, and low tan δ.

Preferably, the ratio of magnesium in the magnesium-aluminum composite oxide to the composite sintered body is not lower than 0.01 weight percentage and not higher than 1.0 weight percentage.

Preferably, the closed porosity of the composite sintered body is not higher than 1.0%.

Preferably, as to the particle diameter of the silicon carbide, D10 is not smaller than 0.3 µm.

Preferably, as to the particle diameter of the silicon carbide, D90 is not smaller than 1.5 µm.

Preferably, the percentage of β-type silicon carbide contained in the silicon carbide is higher than 50%.

Preferably, as to the sintered particle diameter of the aluminum oxide, the average particle diameter is not smaller than 2 µm.

Preferably, the withstand voltage of the composite sintered body is not lower than 25 kV/mm.

Preferably, the dielectric loss tangent of the composite sintered body at a frequency of 40 Hz and at a frequency of 1 MHz is not higher than $1.0 \times 10^{-2}$.

Preferably, the relative dielectric constant of the composite sintered body at a frequency of 40 Hz and at a frequency of 1 MHz is not lower than 12.

Preferably, the volume resistivity of the composite sintered body at a temperature of 25° C. is not lower than $1.0 \times 10^{15}$ Ω·cm.

Preferably, the four-point bending strength of the composite sintered body is not lower than 450 MPa.

Preferably, the open porosity of the composite sintered body is not higher than 0.1%.

The present invention is also intended for a semiconductor manufacturing apparatus member. The semiconductor manufacturing apparatus member according to one preferred embodiment of the present invention is formed by using the above-described composite sintered body. By the present invention, it is possible to suppress the abnormal grain growth of aluminum oxide and provide a semiconductor manufacturing apparatus member having high relative dielectric constant and withstand voltage, and low tan δ.

The present invention is still also intended for a method of manufacturing a composite sintered body. The method of manufacturing a composite sintered body according to one preferred embodiment of the present invention includes a) molding mixed powder in which aluminum oxide, silicon carbide, and magnesium oxide are mixed, into a green body having a predetermined shape, and b) generating a composite sintered body by sintering the green body. The silicon carbide includes β-type silicon carbide. In the operation a), the ratio of the silicon carbide in the mixed powder is not lower than 4.0 weight percentage and not higher than 13.0 weight percentage. The purity of the aluminum oxide in the operation a) is not lower than 99.9%. By the present invention, it is possible to suppress the abnormal grain growth of aluminum oxide and provide a composite sintered body having high relative dielectric constant and withstand voltage, and low tan δ.

Preferably, the ratio of the magnesium oxide in the mixed powder is not lower than 0.05 weight percentage and not higher than 1.0 weight percentage in the operation a).

Preferably, as to the raw material particle diameter of the silicon carbide in the operation a), D10 is not smaller than 0.3 µm, D50 is not smaller than 1 µm, and D90 is not smaller than 2 µm.

Preferably, as to the sintered particle diameter of the aluminum oxide after the operation b), the average particle diameter is not smaller than 2 µm.

DESCRIPTION OF EMBODIMENTS

Figure 1:
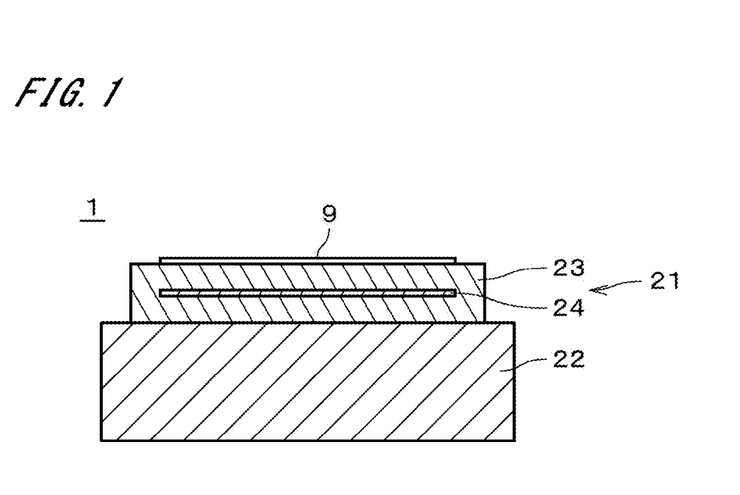
FIG. 1 is a cross section showing an electrostatic chuck.

FIG. 1 is a cross section showing an electrostatic chuck 1 in accordance with one preferred embodiment of the present invention. The electrostatic chuck 1 is a semiconductor manufacturing apparatus member used in a semiconductor manufacturing apparatus. The electrostatic chuck 1 holds a substantially disk-like semiconductor substrate (hereinafter, referred to simply as a "substrate 9") by electrostatically adsorption using the Coulomb force or the Johnsen-Rahbek force.

The electrostatic chuck 1 includes a chuck part 21 and a base part 22. The chuck part 21 is a member having a substantially disk-like shape. The chuck part 21 is attached on the base part 22. The chuck part 21 includes a chuck body 23 and an internal electrode 24. The chuck body 23 is a member which has a substantially disk-like shape and is formed of a composite sintered body. On an upper surface of the chuck body 23, placed is a substrate 9. The internal electrode 24 is an electrode disposed inside the chuck body 23. In the electrostatic chuck 1, by applying a direct-current voltage between the internal electrode 24 and the substrate 9, a portion of the chuck body 23 between the internal electrode 24 and the substrate 9 serves as a dielectric layer, and the substrate 9 is thereby electrostatically adsorbed to the upper surface of the chuck body 23. Though not shown, inside the chuck body 23 on the side of the base part 22, a heater electrode may be provided.

The chuck body 23 is a composite sintered body including $Al_2O_3$ (aluminum oxide), SiC (silicon carbide), and a Mg—Al composite oxide (magnesium-aluminum composite oxide) having a spinel-type crystal structure. In the following description, the above-described Mg—Al composite oxide having a spinel-type crystal structure will be also referred to simply as a "Mg—Al composite oxide". The ratio of C (carbon) to the whole composite sintered body (i.e., the ratio of C in SiC to the composite sintered body) is not lower than 1.0 weight percentage and not higher than 4.0 weight percentage. Preferably, the ratio of C in the composite sintered body is not lower than 1.1 weight percentage and not higher than 3.8 weight percentage. The ratio of Mg in the Mg—Al composite oxide (i.e., the ratio of Mg contained in the Mg—Al composite oxide) to the whole composite sintered body is preferably not lower than 0.01 weight percentage and not higher than 1.0 weight percentage. More preferably, the ratio of Mg in the composite sintered body is not lower than 0.01 weight percentage and not higher than 0.7 weight percentage. In the chuck body 23, SiC particles are dispersed inside the $Al_2O_3$ particles, a grain boundary, and a grain boundary triple point, and particles of Mg—Al composite oxide exist in a form of particles and scattered in the composite sintered body.

As to the particle diameter (i.e., the diameter of a particle) of the SiC particles dispersed in the composite sintered body, D10 is preferably not smaller than 0.3 μm. Further, D50 is preferably not smaller than 0.7 μm. D90 is preferably not smaller than 1.5 μm. D10, D50, and D90 are particle diameters in the cases where the cumulative volume percentage of the SiC particles in a volume particle size distribution is 10 volume percentage, 50 volume percentage, and 90 volume percentage, respectively. As to the sintered particle diameter of $Al_2O_3$ in the chuck body 23, the average particle diameter is preferably not smaller than 2 μm. The closed porosity of the chuck body 23 is preferably not higher than 1.0%.

The withstand voltage of the chuck body 23 is preferably not lower than 25 kV/mm. The tan δ (i.e., the dielectric loss tangent) of the chuck body 23 at a frequency of 40 Hz and at a frequency of 1 MHz is preferably not higher than $1.0 \times 10^{-2}$. More preferably, the tan δ in a range of frequency not lower than 40 Hz and not higher than 1 MHz is not higher than $1.0 \times 10^{-2}$. The relative dielectric constant of the chuck body 23 at a frequency of 40 Hz and at a frequency of 1 MHz is preferably not lower than 12. More preferably, the relative dielectric constant in a range of frequency not lower than 40 Hz and not higher than 1 MHz is not lower than 12. The volume resistivity of the chuck body 23 at a temperature of 25° C. is preferably not lower than $1.0 \times 10^{15}$ Ω·cm. The four-point bending strength of the chuck body 23 is preferably not lower than 450 MPa.

Figure 2:
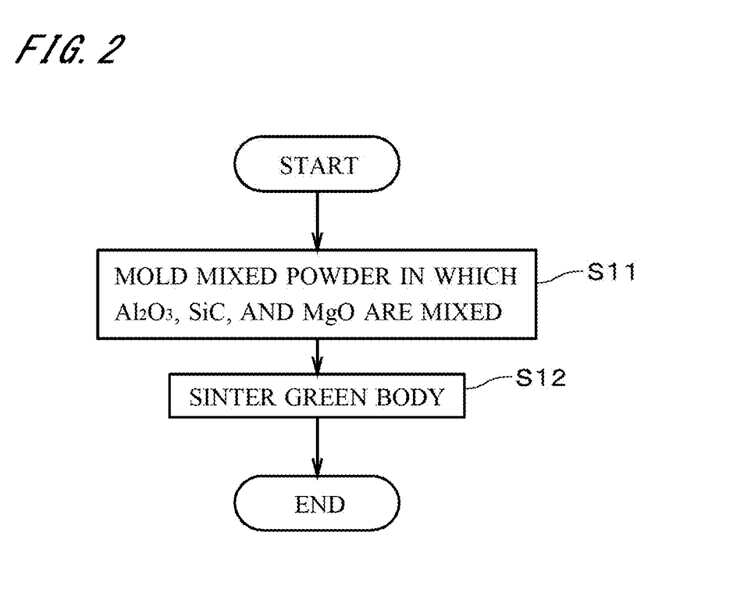
FIG. 2 is a flowchart showing an operation flow for manufacturing a chuck body.

Next, with reference to FIG. 2, a method of manufacturing the chuck body 23 will be described. In the manufacture of the chuck body 23, first, mixed powder in which $Al_2O_3$, SiC, and MgO (magnesium oxide) are mixed is molded into a green body having a predetermined shape (Step S11).

For example, in Step S11, first, respective powders of $Al_2O_3$, SiC, and MgO are wet-mixed in an organic solvent, to thereby become a slurry. Subsequently, the slurry is dried to become mixed powder (i.e., prepared powder), and the mixed powder is molded into the above-described green body. The solvent for the above-described wet mixing may be, for example, ion exchange water. Further, the respective powders of $Al_2O_3$, SiC, and MgO may be dry-mixed, instead of being wet-mixed.

The mixed powder is filled into, for example, a hot press die, to be thereby formed into a green body having a predetermined shape. When the green body has a plate-like shape, the mixed powder may be filled into a die for uniaxial pressing, or the like, to be thereby molded. Formation of the green body may be performed by any one of various other methods only if the shape can be maintained. Further, like the above-described slurry, the mixed powder may be formed into a green body having a predetermined shape by inpouring the mixed powder in a fluid state into a mold and then removing the solvent component.

In Step S11, the ratio of SiC in the above-described mixed powder is not lower than 4.0 weight percentage and not higher than 13.0 weight percentage. Preferably, the ratio of SiC in the mixed powder in Step S11 is not lower than 4.0 weight percentage and not higher than 10.0 weight percentage. Further, the ratio of MgO in the mixed powder is preferably not lower than 0.025 weight percentage and not higher than 1.0 weight percentage, and more preferably not lower than 0.05 weight percentage and not higher than 0.3 weight percentage. The purity of $Al_2O_3$, SiC, and MgO is preferably not lower than 99%, and more preferably not lower than 99.9%.

The SiC used in Step S11 is preferably β-SiC (i.e., SiC having a β-type crystal). It is thereby possible to reduce tan δ as compared with the case where α-SiC (i.e., SiC having an α-type crystal) is used. As to the particle diameter (i.e., the raw material particle diameter) of SiC in Step S11, preferably, D10 is not smaller than 0.3 μm, D50 is not smaller than 1 μm, and D90 is not smaller than 2 μm. Further, the raw material particle diameter herein is a result of measurement by using a particle size distribution measuring device based on laser diffractometry. When a sintered body is obtained through a process of mixture or milling, by setting the particle diameter of SiC raw material in the above-described range, it becomes easier to achieve a particle diameter not smaller than 0.3 μm as D10, a particle diameter not smaller than 0.7 μm as D50, and a particle diameter not smaller than 1.5 μm as D90, as the particle diameter (observed by the SEM (Scanning Electron Microscope) method) of the SiC particles dispersed in the $Al_2O_3$. As a result of measurement of a particle size distribution of the SiC raw material by laser diffractometry, D10 is 0.8 μm, D50 is 2.5 μm, and D90 is 5.7 μm.

After the green body is obtained in Step S11, sintering of the green body is performed and the chuck body 23 which is a composite sintered body is thereby generated (Step S12). In a case of using the hot-press method, the green body is arranged in the hot press die and then heated and pressurized, and the composite sintered body is thereby obtained. In the hot-press method, sintering of the green body is performed, for example, under vacuum atmosphere or non-oxidizing atmosphere. The heating temperature, the press pressure, and the sintering time at the hot press may be determined as appropriate. The maximum heating temperature at the hot press is preferably not lower than 1650° C. and not higher than 1725° C. By setting the maximum temperature in the above-described range, it is possible to avoid remarkable change of the particle size distribution due to sintering of SiC particles or possibility of transforming β-SiC into α-SiC.

The internal electrode 24 may be generated inside the chuck body 23 by burying an electrode material inside the above-described green body concurrently with Step S11 and sintering the electrode material together with the green body in Step S12. Alternatively, by putting the internal electrode 24 between the two composite sintered bodies generated in Steps S11 to S12, the internal electrode 24 may be arranged inside the chuck body 23 formed of the two composite sintered bodies. Generation and arrangement of the internal electrode 24 may be performed by any one of various methods.

Next, with reference to Tables 1 to 6, Experimental Examples 1 to 13 of the composite sintered body in accordance with the present invention and composite sintered bodies of Comparative Examples 1 to 5 to be compared with the composite sintered body of the present invention will be described. As shown in Table 1, among Experimental Examples 1 to 13, at least one of the composition ratio and the maximum sintering temperature of $Al_2O_3$, SiC, and MgO which are raw materials is different. In Experimental Examples 1 to 13, the ratio of SiC to the mixed powder of $Al_2O_3$, SiC, and MgO is not lower than 4.0 weight percentage and not higher than 13.0 weight percentage. In Experimental Examples 1 to 13, as the raw material SiC, β-SiC powder is used. Further, in Experimental Examples 1 to 13, the ratio of MgO to the mixed powder is not lower than 0.05 weight percentage and not higher than 1.0 weight percentage.

In Comparative Example 1, the raw material includes only $Al_2O_3$ and does not include SiC or MgO. In Comparative Example 2, the raw material includes $Al_2O_3$ and SiC and does not include MgO. In Comparative Example 3, $Al_2O_3$ powder having low purity (lower than 99%) is used as the raw material. In Comparative Example 4, SiC powder having a small average particle diameter of 0.3 μm (having a purity of 99% or higher) is used as the raw material. Further, the raw material SiC in Comparative Example 4 includes α-SiC powder and β-SiC powder. In Comparative Example 5, as raw material SiC, α-SiC powder is used. In Comparative Example 5, the α-SiC powder having a purity of 98% or higher and an average particle diameter of 2.9 μm is used as the raw material.

<Raw Material Powder>

In Experimental Examples 1 to 13, as $Al_2O_3$, used is high purity $Al_2O_3$ powder having a purity of 99.99% or higher and an average particle diameter of 0.4 to 0.6 μm. As to the content percentage of impurities in the high purity $Al_2O_3$ powder, the content percentage of Si is 40 ppm or lower, those of Mg, Na, and copper (Cu) are each 10 ppm or lower, and that of iron (Fe) is 20 ppm or lower. In Experimental Examples 1 to 13, as SiC, used is β-SiC powder having a purity of 99.9% or higher and an average particle diameter of 2.5 μm. As to the content percentage of impurities in the β-SiC powder, the content percentage of Al is 100 ppm or lower and those of Mg and Na are each 50 ppm or lower. As MgO, used is high purity MgO powder having a purity of 99.9% or higher and an average particle diameter of 1 μm or smaller. As to the content percentage of impurities in the MgO powder, the content percentage of Al is 10 ppm or lower and that of Si is 10 ppm or lower. Also in Comparative Examples 1 to 5, details of the raw material powders are the same as those in Experimental Examples when there is no particular description thereof in the previous paragraph.

<Mixed Powder>

The above-described raw material powder is weighed to have an amount (weight percentage) shown in Table 1 and wet-mixed for four hours by using a nylon pot and isopropyl alcohol (IPA) as a solvent. For the wet mixing, an alumina pebble having a diameter (φ) of 3 mm is used in Experimental Examples 1 to 4, Experimental Examples 7 to 9, and Comparative Examples 1 to 5, and an iron-core nylon ball having a diameter (φ) of 20 mm is used in Experimental Examples 5 to 6 and Experimental Examples 10 to 13. The pebble used in mixing is not particularly limited, but in a case where a pebble having high specific gravity and high grinding efficiency is used, for example, caution is required since milling of the raw material powder (herein, the SiC particles) is promoted and the particle diameter after the wet mixing sometimes becomes smaller than the raw material particle diameter. In order to keep the particle diameter of the SiC particles dispersed in $Al_2O_3$ within the above-described preferable range, it is preferable that the wet mixing time should be adjusted as appropriate between four and twenty hours. The slurry after mixing is taken out and dried at 110° C. in the nitrogen stream. After that, the dried powder is sieved by a 30-mesh sieve, to thereby obtain mixed powder. The solvent for the wet mixing may be, for example, ion exchange water. Further, there may be a case where the slurry is dried by using a rotary evaporator and then sieved by a 100-mesh sieve, to thereby obtain mixed powder. Alternatively, granulated powder may be obtained by using a spray dryer or the like. Further, as necessary, a heat treatment is performed on the mixed powder at 450° C. for five hours or more under the atmosphere, to thereby remove a carbon component contaminated during the wet mixing.

<Molding>

Uniaxial pressing of the above-described mixed powder is performed with a pressure of 100 kgf/cm$^2$, to thereby form a disk-like green body having a diameter (φ) of 50 mm and a thickness of about 20 mm, and the green body is accommodated in a sintering graphite mold. The molding pressure is not particularly limited but may be variously changed only if the shape can be maintained. The mixed powder may be filled into the hot-press die in a state of unmolded powder.

<Sintering>

The above-described green body is sintered by the hot-press method under vacuum atmosphere. The press pressure is 250 kgf/cm$^2$. The maximum temperature at heating is from 1650° C. to 1725° C., and the holding time at the maximum temperature is four to eight hours.

TABLE 1

| | Raw Material | | | | | | |
|---|---|---|---|---|---|---|---|
| | Al₂O₃ | | SiC | | | | |
| | wt % | High Purity | wt % | Crystal Type | Average Particle Diameter (μm) | MgO wt % | Maximum Temperature °C |
| Experimental Example 1 | 91.7 | ○ | 8.2 | β | 2.5 | 0.1 | 1700 |
| Experimental Example 2 | 93.3 | ○ | 6.6 | β | 2.5 | 0.1 | 1700 |
| Experimental Example 3 | 95.2 | ○ | 4.7 | β | 2.5 | 0.1 | 1700 |
| Experimental Example 4 | 90.0 | ○ | 9.9 | β | 2.5 | 0.1 | 1700 |
| Experimental Example 5 | 93.4 | ○ | 6.6 | β | 2.5 | 0.05 | 1700 |
| Experimental Example 6 | 94.6 | ○ | 5.3 | β | 2.5 | 0.05 | 1700 |
| Experimental Example 7 | 87.4 | ○ | 12.5 | β | 2.5 | 0.1 | 1700 |
| Experimental Example 8 | 93.0 | ○ | 6.5 | β | 2.5 | 0.5 | 1700 |
| Experimental Example 9 | 93.3 | ○ | 6.6 | β | 2.5 | 0.1 | 1650 |
| Experimental Example 10 | 93.3 | ○ | 6.6 | β | 2.5 | 0.1 | 1725 |
| Experimental Example 11 | 93.2 | ○ | 6.5 | β | 2.5 | 0.3 | 1700 |
| Experimental Example 12 | 95.0 | ○ | 4.0 | β | 2.5 | 1.0 | 1650 |
| Experimental Example 13 | 95.0 | ○ | 4.1 | β | 2.5 | 0.075 | 1750 |
| Comparative Example 1 | 100.0 | ○ | 0.0 | — | — | — | 1700 |
| Comparative Example 2 | 91.8 | ○ | 8.2 | β | 2.5 | — | 1700 |
| Comparative Example 3 | 90.0 | — | 9.9 | β | 2.5 | 0.1 | 1650 |
| Comparative Example 4 | 90.0 | ○ | 9.9 | α, β | 0.3 | 0.1 | 1650 |
| Comparative Example 5 | 90.0 | ○ | 9.9 | α | 2.9 | 0.1 | 1650 |

TABLE 2

| | Open Porosity % | Bulk Density g/cm³ | Relative Density % | Closed Porosity % |
|---|---|---|---|---|
| Experimental Example 1 | 0.02 | 3.89 | 99.6 | 0.4 |
| Experimental Example 2 | 0.02 | 3.92 | 99.7 | 0.3 |
| Experimental Example 3 | 0.02 | 3.93 | 99.6 | 0.4 |
| Experimental Example 4 | 0.01 | 3.88 | 99.5 | 0.5 |
| Experimental Example 5 | 0.01 | 3.91 | 99.5 | 0.5 |
| Experimental Example 6 | 0.02 | 3.92 | 99.6 | 0.2 |
| Experimental Example 7 | 0.01 | 3.87 | 99.7 | 0.2 |
| Experimental Example 8 | 0.01 | 3.92 | 99.7 | 0.3 |
| Experimental Example 9 | 0.01 | 3.91 | 99.6 | 0.4 |
| Experimental Example 10 | 0.01 | 3.92 | 99.7 | 0.3 |
| Experimental Example 11 | 0.01 | 3.91 | 99.7 | 0.4 |
| Experimental Example 12 | 0.00 | 3.93 | 99.6 | 0.4 |
| Experimental Example 13 | 0.01 | 3.93 | 99.7 | 0.2 |
| Comparative Example 1 | 0.07 | 3.97 | 99.6 | 0.4 |
| Comparative Example 2 | 0.07 | 3.87 | 98.9 | 1.1 |
| Comparative Example 3 | 0.15 | 3.87 | 98.9 | 1.0 |
| Comparative Example 4 | 0.11 | 3.88 | 99.3 | 1.2 |
| Comparative Example 5 | 0.04 | 3.89 | 99.5 | 0.8 |

TABLE 3

| | Strength MPa | Relative Dielectric Constant @300 KHz | Volume Resistivity Ω·cm | Withstand Voltage kV/mm |
|---|---|---|---|---|
| Experimental Example 1 | 783 | 16 | 3.4E+16 | 50 |
| Experimental Example 2 | 554 | 14 | 1.0E+17 | 66 |
| Experimental Example 3 | 715 | 13 | 1.1E+17 | 110 |
| Experimental Example 4 | 686 | 19 | 3.7E+16 | 32 |
| Experimental Example 5 | 574 | 14 | 5.1E+16 | 64 |
| Experimental Example 6 | 582 | 14 | 8.2E+16 | 85 |
| Experimental Example 7 | 623 | 20 | 8.1E+16 | 28 |
| Experimental Example 8 | 677 | 13 | 6.3E+16 | 65 |
| Experimental Example 9 | 530 | 13 | 8.8E+16 | 63 |
| Experimental Example 10 | 559 | 14 | 5.5E+16 | 65 |
| Experimental Example 11 | 594 | 14 | 9.1E+16 | 78 |
| Experimental Example 12 | 557 | 12 | 1.0E+17 | 117 |
| Experimental Example 13 | 566 | 13 | 8.8E+16 | 100 |
| Comparative Example 1 | 279 | 10 | 4.8E+16 | 41 |
| Comparative Example 2 | 433 | 16 | 5.2E+16 | 51 |
| Comparative Example 3 | 298 | 19 | 2.3E+16 | 29 |
| Comparative Example 4 | 489 | 18 | 2.7E+16 | 26 |
| Comparative Example 5 | 591 | 18 | 5.5E+16 | 32 |

TABLE 4

| | tan δ @40 Hz | tan δ @300 KHz | tan δ @1 MHz |
|---|---|---|---|
| Experimental Example 1 | <1.0E-03 | 2.5E-03 | 4.2E-03 |
| Experimental Example 2 | <1.0E-03 | 1.0E-03 | 1.5E-03 |
| Experimental Example 3 | <1.0E-03 | <1.0E-03 | <1.0E-03 |
| Experimental Example 4 | 1.5E-03 | 3.5E-03 | 8.4E-03 |

TABLE 4-continued

|  | tan δ @40 Hz | tan δ @300 KHz | tan δ @1 MHz |
|---|---|---|---|
| Experimental Example 5 | <1.0E-03 | 1.2E-03 | 1.6E-03 |
| Experimental Example 6 | <1.0E-03 | <1.0E-03 | 1.1E-03 |
| Experimental Example 7 | <1.0E-03 | 4.5E-03 | 7.3E-03 |
| Experimental Example 8 | <1.0E-03 | 1.8E-03 | 3.9E-03 |
| Experimental Example 9 | <1.0E-03 | <1.0E-03 | 1.5E-03 |
| Experimental Example 10 | <1.0E-03 | 1.8E-03 | 3.0E-03 |
| Experimental Example 11 | <1.0E-03 | 2.4E-03 | 3.9E-03 |
| Experimental Example 12 | <1.0E-03 | <1.0E-03 | <1.0E-03 |
| Experimental Example 13 | <1.0E-03 | <1.0E-03 | <1.0E-03 |
| Comparative Example 1 | <1.0E-03 | <1.0E-03 | <1.0E-03 |
| Comparative Example 2 | <1.0E-03 | 1.6E-03 | 2.5E-03 |
| Comparative Example 3 | <1.0E-03 | 3.1E-03 | 6.8E-03 |
| Comparative Example 4 | <1.0E-03 | 2.9E-03 | 2.5E-03 |
| Comparative Example 5 | <1.0E-03 | 2.3E-03 | 2.4E-03 |

TABLE 5

|  | SiC Particle Diameter | | | $Al_2O_3$ Average Particle Diameter μm | Particle Diameter Ratio L1/L2 |
|---|---|---|---|---|---|
|  | D10 μm | D50 μm | D90 μm | | |
| Experimental Example 1 | 0.5 | 0.9 | 1.7 | 2.9 | 4.1 |
| Experimental Example 2 | 0.7 | 1.1 | 2.1 | 2.6 | 3.7 |
| Experimental Example 3 | 0.5 | 1.0 | 1.7 | 3.5 | 2.4 |
| Experimental Example 4 | 0.5 | 1.0 | 2.1 | 3.0 | 3.0 |
| Experimental Example 5 | 0.7 | 1.4 | 2.6 | 2.4 | 7.3 |
| Experimental Example 6 | 0.9 | 1.8 | 3.1 | 3.0 | 7.4 |
| Experimental Example 7 | 0.6 | 0.9 | 1.5 | 2.8 | 4.0 |
| Experimental Example 8 | 0.3 | 0.7 | 1.6 | 2.7 | 7.7 |
| Experimental Example 9 | 0.6 | 1.3 | 2.2 | 3.0 | 3.1 |
| Experimental Example 10 | 0.6 | 0.9 | 1.7 | 4.1 | 2.3 |
| Experimental Example 11 | 0.6 | 1.0 | 1.5 | 4.6 | 2.8 |
| Experimental Example 12 | 0.5 | 1.3 | 1.7 | 4.6 | 2.7 |
| Experimental Example 13 | 0.7 | 1.2 | 2.6 | 2.5 | 2.5 |
| Comparative Example 1 | — | — | — | 17.5 | 2.9 |
| Comparative Example 2 | 0.7 | 1.0 | 2.0 | 93.3 | 3.1 |
| Comparative Example 3 | 0.5 | 1.1 | 2.4 | 8.7 | 3.5 |
| Comparative Example 4 | 0.1 | 0.3 | 0.9 | 1.4 | 2.9 |
| Comparative Example 5 | 0.8 | 1.8 | 3.5 | 4.1 | 2.4 |

TABLE 6

|  | Amount of C in Sintered Body wt % | Amount of Mg in Sintered Body wt % | Crystal Phase Identified by XRD |
|---|---|---|---|
| Experimental Example 1 | 2.48 | 0.06 | $Al_2O_3$, SiC(β), $MgAl_2O_4$ |
| Experimental Example 2 | 1.97 | 0.05 | $Al_2O_3$, SiC(β), $MgAl_2O_4$ |
| Experimental Example 3 | 1.41 | 0.05 | $Al_2O_3$, SiC(β), $MgAl_2O_4$ |
| Experimental Example 4 | 2.97 | 0.06 | $Al_2O_3$, SiC(β), $MgAl_2O_4$ |
| Experimental Example 5 | 2.02 | 0.02 | $Al_2O_3$, SiC(β), $MgAl_2O_4$ |
| Experimental Example 6 | 1.52 | 0.03 | $Al_2O_3$, SiC(β), $MgAl_2O_4$ |
| Experimental Example 7 | 3.71 | 0.07 | $Al_2O_3$, SiC(β), $MgAl_2O_4$ |
| Experimental Example 8 | 1.93 | 0.29 | $Al_2O_3$, SiC(β), $MgAl_2O_4$ |
| Experimental Example 9 | 1.99 | 0.04 | $Al_2O_3$, SiC(β), $MgAl_2O_4$ |
| Experimental Example 10 | 1.97 | 0.05 | $Al_2O_3$, SiC(β), $MgAl_2O_4$ |
| Experimental Example 11 | 1.96 | 0.17 | $Al_2O_3$, SiC(β), $MgAl_2O_4$ |
| Experimental Example 12 | 1.18 | 0.57 | $Al_2O_3$, SiC(β), $MgAl_2O_4$ |
| Experimental Example 13 | 1.20 | 0.03 | $Al_2O_3$, SiC(β), $MgAl_2O_4$ |
| Comparative Example 1 | 0.01 | — | $Al_2O_3$ |
| Comparative Example 2 | 2.48 | — | $Al_2O_3$, SiC(β) |
| Comparative Example 3 | 2.95 | 0.05 | $Al_2O_3$, SiC(β) |
| Comparative Example 4 | 2.93 | 0.06 | $Al_2O_3$, SiC(β), SiC(α), $MgAl_2O_4$ |
| Comparative Example 5 | 2.93 | 0.07 | $Al_2O_3$, SiC(α), $MgAl_2O_4$ |

<Evaluation>

The composite sintered body obtained by the above-described sintering is processed for each type of evaluation, and evaluations shown in Tables 2 to 6 are performed.

The open porosity, the bulk density, and the apparent density are measured by the Archimedes' method using pure water as a medium. For the measurement, a flexural bar having a size of 3 mm×4 mm×40 mm is used, and the surface is finished with #800. The theoretical density is calculated on the basis of the theoretical density of each raw material and the amount (weight percentage) of usage of each raw material, assuming that all the raw materials ($Al_2O_3$, SiC, and MgO) which are mixed in the manufacture of the composite sintered body remain in the composite sintered body without any change. The theoretical density of $Al_2O_3$ which is used for the calculation is 3.99 g/cm$^3$, that of SiC is 3.22 g/cm³, and that of MgO is 3.60 g/cm³. The relative density is calculated by dividing the bulk density by the theoretical density and then multiplying the quotient by 100. Assuming that the above-described theoretical density is equal to the true density, the closed porosity is calculated by subtracting the quotient obtained by dividing the apparent density by the true density from 1 and then multiplying the difference by 100.

The four-point bending strength is calculated by performing a four-point bending test in conformity with "JIS R1601". The relative dielectric constant and tan δ is measured by the method in conformity with "JIS C2141" using a specimen having a thickness of 2 mm at room temperature in the atmosphere.

The volume resistivity is measured by the method in conformity with "JIS C2141" at room temperature under vacuum atmosphere. The specimen configuration is φ50 mm×1 mm. The diameter of a main electrode is 20 mm. The inner diameter and the outer diameter of a guard electrode are 30 mm and 40 mm, respectively. The diameter of an application electrode is 45 mm. The main electrode, the guard electrode, and the application electrode are formed of Ag (silver). The applied voltage is 500 V/mm. A current value after one minute has elapsed from voltage application is read and the volume resistivity is calculated from the current value.

The withstand voltage is an instantaneous withstand voltage measured by a method in conformity with "JIS C2141" using a specimen having a thickness of 0.2 mm, by applying a direct-current voltage at room temperature in the atmosphere.

Figure 3:
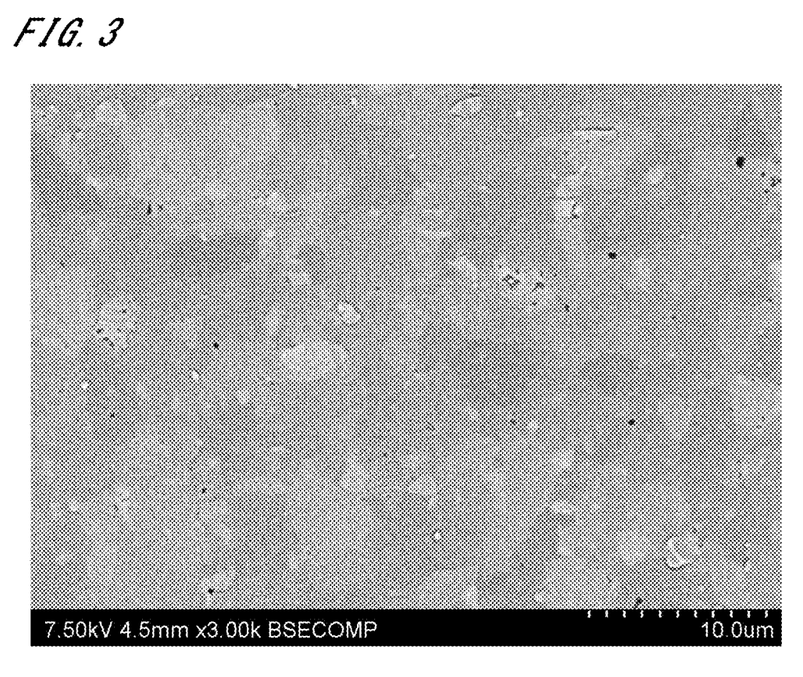
FIG. 3 is a SEM image of a polished surface of a composite sintered body.
Figure 4:
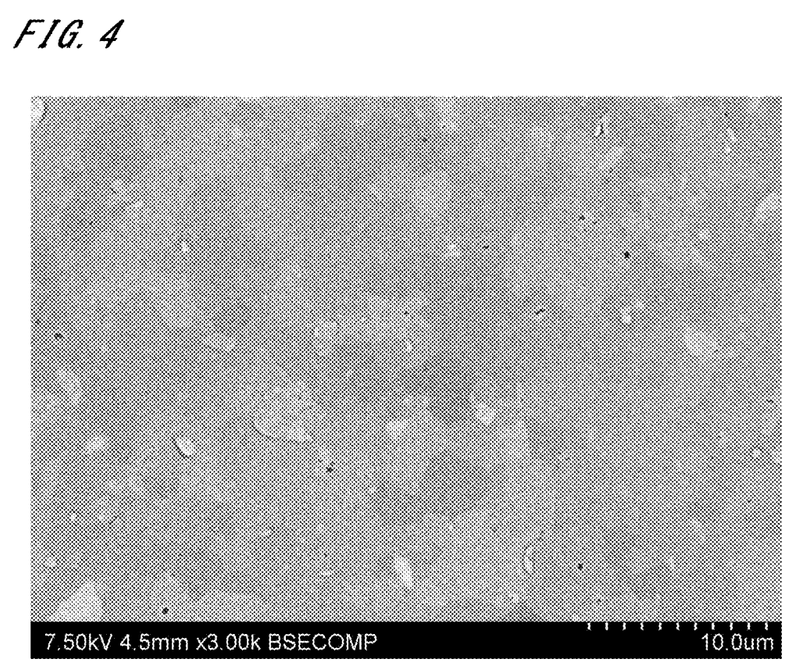
FIG. 4 is a SEM image of a polished surface of another composite sintered body.

The particle diameter of SiC is obtained by the SEM observation method. Specifically, in a SEM image obtained by observing a polished surface of the composite sintered body with a magnification of 3000 times or more, the long diameter of SiC particle is measured as a particle diameter, and the respective particle diameters of particles corresponding to 10%, 50%, and 90% from one having the smallest particle diameter among all the measurement results (60 pieces or more) are D10, D50, and D90, respectively. FIGS. 3 and 4 are respective SEM images of the polished surfaces of the composite sintered bodies in Experimental Examples 1 and 2.

The particle diameter of $Al_2O_3$ is measured by the intercept method. Specifically, any number of line segments are drawn in a SEM image obtained by observing the polished surface of the composite sintered body, and the number n of crystal particles crossing the line segment having a length L is obtained. Further, when an end of the line segment is located inside the crystal particle, the crystal particle is counted as ½. Assuming that a value obtained by dividing the length L of the line segment by n is an average particle size (i.e., average segment length) of 1, a value obtained by multiplying the average particle size of 1 by a coefficient of 1.5 is the average particle diameter.

Figure 5:
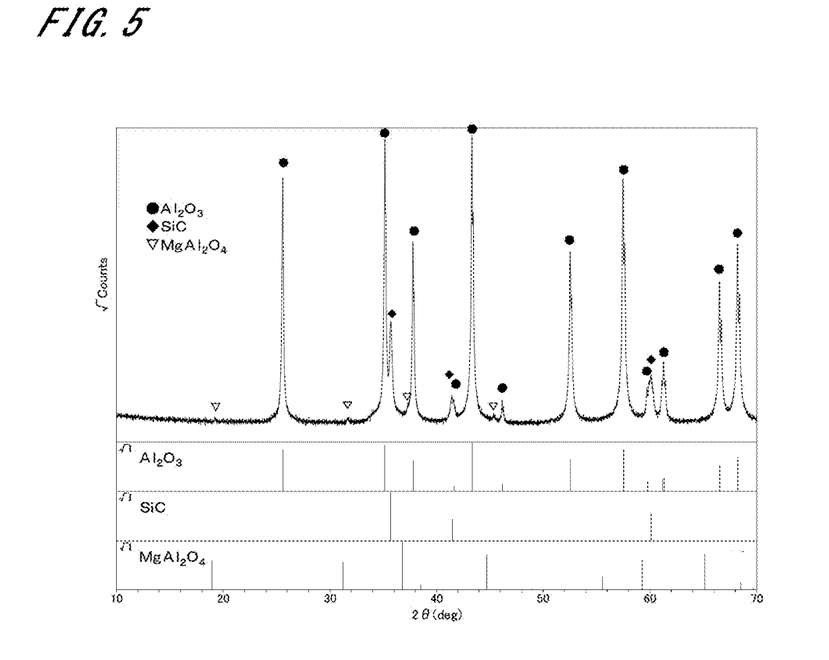
FIG. 5 is a view showing an X-ray diffraction pattern of the composite sintered body.

The particle diameter ratio L1/L2 of $Al_2O_3$ is obtained by dividing the maximum length L1 of the line segment on one $Al_2O_3$ particle by the minimum length L2 of the line segment on one $Al_2O_3$ particle in any number of line segments on the above-described SEM image. The particle diameter ratio L1/L2 of $Al_2O_3$ becomes closer to 1 as the uniformity of distribution of the crystal particle diameter of $Al_2O_3$ becomes higher and becomes farther from 1 and a larger value as the uniformity becomes lower. As shown in FIG. 5, as the content percentage of MgO which is a raw material becomes lower, the particle diameter ratio L1/L2 of $Al_2O_3$ tends to become larger. When the particle diameter ratio L1/L2 of $Al_2O_3$ approximates to 1, the inplane uniformity of corrosion is increased in the chuck body 23 of the electrostatic chuck 1, and as a result, undesirable dust generation is suppressed. In terms of increasing the uniformity of distribution of the crystal particle diameter of $Al_2O_3$, the particle diameter ratio L1/L2 of $Al_2O_3$ is preferably not more than 8, and more preferably not more than 5. Therefore, the ratio of Mg in the Mg—Al composite oxide to the composite sintered body is preferably not lower than 0.05 weight percentage, and more preferably not lower than 0.075 weight percentage.

The ratio of C (the amount of C) in SiC to the whole composite sintered body and the ratio of Mg (the amount of Mg) in the Mg—Al composite oxide having a spinel-type crystal structure to the whole composite sintered body are obtained by analysis methods in conformity with "JIS R1616" and "JIS R1649". The amount of C is a value obtained by subtracting the amount of free C from all the amount of C in the composite sintered body. The amount of free C is caused by impurity carbon in the raw material and the pebbles used in the mixing, and in Experimental Example 1, for example, the amount of free C is 0.03 weight percentage. Herein, the ratio of the amount of SiC to the whole composite sintered body can be derived by using the amount of C and the atomic weight of carbon (12.01) and the molecular weight of SiC (40.1). In Experimental Example 1, for example, since the amount of C is 2.48 weight percentage from Table 2, the amount of SiC can be derived to be 8.3 weight percentage. In Experimental Example 4, since the amount of C is 2.97 weight percentage, the amount of SiC can be derived to be 9.9 weight percentage. This value is sometimes different from the amount of SiC in the raw material composition ratio of Table 1. This is because this value includes errors of the amount of impurities, the weighting, the analysis of the powder raw material, and the like. Further, though the ratio of the amount of SiC to the whole composite sintered body can be derived by analyzing the amount of C and the amount of SiC with respect to the whole composite sintered body, in the range of Experimental Examples of this time, in consideration of the possibility that Si together with the Mg—Al composite oxide forms a reaction phase by the reaction of part of SiC, it is preferable to derive the ratio by using the amount of C (when SiC responds, C is discharged to the outside of the system in sintering).

In Experimental Examples 1 to 13, the open porosity is not higher than 0.1%, the closed porosity is not higher than 1.0%, and the four-point bending strength is not lower than 450 MPa. Further, the relative dielectric constant at a frequency of 300 kHz is not lower than 12. The volume resistivity is not lower than $1.0 \times 10^{15}$ Ω·cm, and the withstand voltage is not lower than 25 kV/mm. In Experimental Examples 1 to 13, tan δ at a frequency of 40 Hz, 300 kHz, and 1 MHz is not higher than $1.0 \times 10^{-2}$. In Experimental Examples 1 to 13, as to the particle diameter of SiC, D10 is not smaller than 0.3 μm, D50 is not smaller than 0.7 μm, and D90 is not smaller than 1.5 μm. The sintered particle diameter (average particle diameter) of $Al_2O_3$ is not smaller than 2 μm. The ratio of C in SiC (the amount of C) to the whole composite sintered body is not lower than 1.0 weight percentage and not higher than 4.0 weight percentage. The ratio of Mg in the Mg—Al composite oxide (the amount of Mg) to the whole composite sintered body is not lower than 0.01 weight percentage and not higher than 1.0 weight percentage.

In Comparative Examples 1 to 3, the composite sintered body includes no Mg—Al composite oxide having a spinel-type crystal structure. In Comparative Example 1, the relative dielectric constant is lower than 12. In Comparative Example 2, the closed porosity is larger than 1.0%. It is thought that an increase in the closed porosity in Comparative Example 2 is caused by abnormal grain growth (i.e., excessive enlargement of a particle, also referred to as coarsening of the particle diameter) of $Al_2O_3$ due to no addition of MgO. The average particle diameter of $Al_2O_3$ in the sintered body in Comparative Example 2 is 93.3 μm. In Comparative Example 3, the open porosity is larger than 0.1%. It is thought that an increase in the open porosity in Comparative Example 3 is caused by occurrence of the abnormal grain growth of $Al_2O_3$ since the purity of the $Al_2O_3$ powder which is a raw material is low and the Mg—Al composite oxide having a spinel-type crystal structure is not thereby substantially formed. The average particle diameter of $Al_2O_3$ in the sintered body in Comparative Example 3 is 8.7 μm. In Comparative Example 4, as to the particle diameter of SiC, D10 is smaller than 0.3 μm, D50 is smaller than 0.7 μm, and D90 is smaller than 1.5 μm. It is thought that this is because the average particle diameter of SiC which is a raw material is small, being 0.3 μm. Further, in Comparative Example 4, the open porosity is larger than 0.1% and the closed porosity is larger than 1.0%. It is thought that increases in the open porosity and the closed porosity in Comparative Example 4 are caused by that the average particle diameter of SiC which is a raw material is small, being 0.3 μm. In Comparative Example 4, tan δ at a frequency of 300 kHz and at a frequency of 1 MHz is higher than $1.0 \times 10'$. It is thought that an increase in the tan δ is caused by that the SiC which is a raw material includes α-SiC. In Comparative Example 5, tan δ at a frequency of 40 Hz is not higher than $1.0 \times 10^{-2}$, but tan δ at a frequency of 300 kHz and at a frequency of 1 MHz is higher than $1.0 \times 10^{-2}$. It is thought that an increase in the tan δ at a frequency of 300 kHz and at a frequency of 1 MHz is caused by that the SiC which is a raw material is α-SiC.

Each of Experimental Examples 14 to 17 in Tables 7 and 8 shows a relation between the content percentage of α-SiC in SiC contained in the raw material and the relative dielectric constant and the tan δ in the composite sintered body. The composite sintered bodies of Experimental Examples 14 to 17 are manufactured by the same manufacturing method as that in above-described Experimental Examples 1 to 13. In Experimental Examples 14 to 17, the above-described content percentage of α-SiC is changed. The content percentage of α-SiC powder is obtained by dividing the weight of the α-SiC powder in the SiC powder by the total weight of the SiC powder (i.e., the sum of the weight of the α-SiC powder and the weight of the β-SiC powder). The same applies to the content percentage of β-SiC. Further, the α-SiC powder and the β-SiC powder used in Experimental Examples 14 to 17 are the same as those in Comparative Example 5 and Experimental Example 1, respectively.

TABLE 7

Raw Material Composition

| | $Al_2O_3$ wt % | SiC wt % | MgO wt % | Content Percentage of α-SiC in SiC % | Content Percentage of β-SiC in SiC % |
|---|---|---|---|---|---|
| Experimental Example 14 | 93.3 | 6.6 | 0.1 | 5 | 95 |

TABLE 7-continued

Raw Material Composition

| | $Al_2O_3$ wt % | SiC wt % | MgO wt % | Content Percentage of α-SiC in SiC % | Content Percentage of β-SiC in SiC % |
|---|---|---|---|---|---|
| Experimental Example 15 | 93.3 | 6.6 | 0.1 | 10 | 90 |
| Experimental Example 16 | 93.3 | 6.6 | 0.1 | 25 | 75 |
| Experimental Example 17 | 93.3 | 6.6 | 0.1 | 50 | 50 |

TABLE 8

Sintered Body Properties

| | Relative Dielectric Constant @300 KHz | tan δ @40 Hz | tan δ @300 KHz | tan δ @1 MHz |
|---|---|---|---|---|
| Experimental Example 14 | 14.2 | <1.0E−03 | 1.8E−03 | 2.2E−03 |
| Experimental Example 15 | 14.5 | 1.2E−03 | 3.2E−03 | 3.9E−03 |
| Experimental Example 16 | 14.5 | 3.5E−03 | 7.1E−03 | 7.8E−03 |
| Experimental Example 17 | 14.8 | 1.2E−02 | 1.4E−02 | 1.3E−02 |

In Experimental Examples 14 to 17, the content percentage of α-SiC is 5%, 10%, 25%, and 50%, respectively, and the content percentage of β-SiC is 95%, 90%, 75%, and 50%, respectively. In Experimental Examples 14 to 16, the relative dielectric constant at a frequency of 300 kHz is not lower than 12, and the tan δ at a frequency of 40 Hz, 300 kHz, and 1 MHz is not higher than $1.0 \times 10^{-2}$. In Experimental Example 17, the relative dielectric constant is not lower than 12, but the tan δ at a frequency of 40 Hz, 300 kHz, and 1 MHz is higher than $1.0 \times 10^{-2}$. In Experimental Examples 14 to 17, the tan δ at a frequency of 40 Hz, 300 kHz, and 1 MHz becomes higher as the content percentage of β-SiC becomes lower. In terms of reducing the tan δ, it is preferable that the content percentage of β-SiC in SiC contained in the raw material should be higher than 50%.

Further, though not shown in Table 7 or 8, in Experimental Examples 14 to 17, the open porosity is not higher than 0.1%, the closed porosity is not higher than 1.0%, and the four-point bending strength is not lower than 450 MPa. Furthermore, the volume resistivity is not lower than $1.0 \times 10^{15}$ Ω·cm, and the withstand voltage is not lower than 25 kV/mm. As to the particle diameter of SiC, D10 is not smaller than 0.3 μm, D50 is not smaller than 0.7 μm, and D90 is not smaller than 1.5 μm. The sintered particle diameter (average particle diameter) of $Al_2O_3$ is not smaller than 2 μm. The ratio of C (the amount of C) in SiC to the whole composite sintered body is not lower than 1.0 weight percentage and not higher than 4.0 weight percentage. The ratio of Mg (the amount of Mg) in the Mg—Al composite oxide to the whole composite sintered body is not lower than 0.01 weight percentage and not higher than 1.0 weight percentage. Further, in Experimental Examples 14 to 17, it is confirmed by the Rietveld method that the content percentage of α-SiC in SiC contained in the composite sintered body is substantially equal to the content percentage of α-SiC in SiC contained in the raw material. The Rietveld method is performed in conformity with "JIS K 0131" (General rules for X-ray diffraction analysis).

FIG. 5 is a view showing an X-ray diffraction pattern obtained by measuring the composite sintered body powder in Experimental Example 2 by an X-ray diffraction apparatus. In this measurement, the composite sintered body which is a material is crushed by using a mortar and a crystal phase is identified by the X-ray diffraction apparatus. The measurement conditions are CuKα, 40 kV, 40 mA, and 2θ=5-70°, and a sealed-tube X-ray diffraction apparatus (D8-ADVANCE manufactured by Bruker AXS) is used. The step width of the measurement is 0.02°.

In FIG. 5 (Experimental Example 2), as a constituent phase, three phases of $Al_2O_3$, SiC, and $MgAl_2O_4$ (spinel) are detected. The peak which coincides with the spinel is detected as a very small peak.

Figure 6:
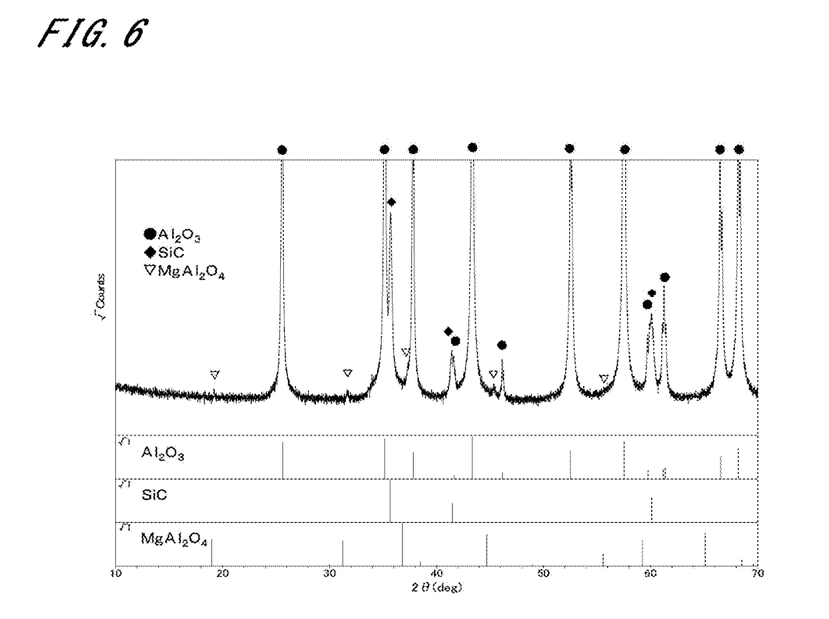
FIG. 6 is an enlarged view showing the X-ray diffraction pattern of the composite sintered body.

FIG. 6 is a view enlarging a low-count portion of FIG. 5 in order to clarify the peak of $MgAl_2O_4$. In FIG. 6, the peak of $MgAl_2O_4$ on the high-angle side is buried among other peaks and it is difficult to specify a clear peak position. In Experimental Example 2, the peak position of $MgAl_2O_4$ is shifted, as compared with the general peak position of $MgAl_2O_4$ shown on the lower side of FIG. 6. Therefore, in the composite sintered body of the present preferred embodiment, though Mg is contained as the of $MgAl_2O_4$-type crystal phase (i.e., the Mg—Al composite oxide having a spinel-type crystal structure), it is thought that a change in the constituent element ratio or a solid solution reaction, for example, occurs due to the coexistence of SiC.

Then, in the composite sintered body of the present preferred embodiment, a tissue containing Mg is described as a Mg—Al composite oxide as described earlier. In the Mg—Al composite oxide, Si may be contained by solid solution. Further, in the composite sintered body of the present preferred embodiment, also considered is a case where the peak of $MgAl_2O_4$ cannot be detected from the X-ray diffraction pattern due to deterioration of the crystallinity thereof or the like. In this case, the existence of the Mg—Al composite oxide can be found by elemental mapping using EDS (Energy Dispersive x-ray Spectroscopy) or EPMA (Electron Probe x-ray Micro Analyzer).

Figure 7:
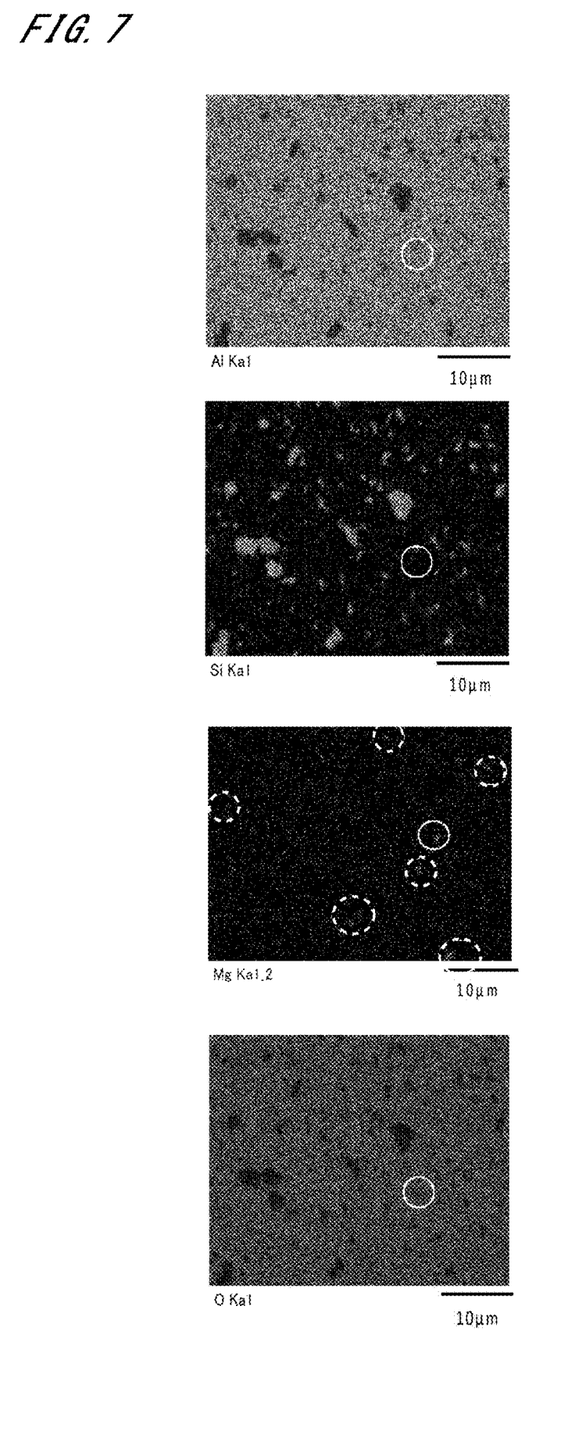
FIG. 7 is a view showing elemental mapping images of the composite sintered body.

FIG. 7 shows images of EDS elemental mapping performed on the composite sintered body of Experimental Example 2 with a magnification of 1000 times. As to the elements of Al, Si, Mg, and O, each element exists at higher density in a portion where the color is brighter (closer to white in this figure). In a distribution chart of Al of FIG. 7, the gray ground color portion is an existing position of $Al_2O_3$, and Al is not detected at a black portion scattered in an island shape. As compared with respective distribution charts of Si and O, Si is detected and O is not detected in the island-shaped portion. From this fact, it can be seen that the island-shaped portion corresponds to the SiC particles and SiC are dispersed granularly in the $Al_2O_3$.

Further, in the distribution chart of Mg of FIG. 7, an area surrounded by a solid-line circle or a broken-line circle is an area where Mg exists. On the other hand, in the respective distribution charts of Al, Si, and O, an area surrounded by a solid-line circle is an area overlapping the area surrounded by the solid-line circle in the distribution chart of Mg. In the areas surrounded by the solid-line circles, Al and O exist and Si hardly exists in the portion where Mg exists. Therefore, in this portion, the Mg—Al composite oxide exists. Similarly, also in the area surrounded by the broken-line circle in the distribution chart of Mg, the Mg—Al composite oxide exists in the portion where Mg exists.

Figure 8:
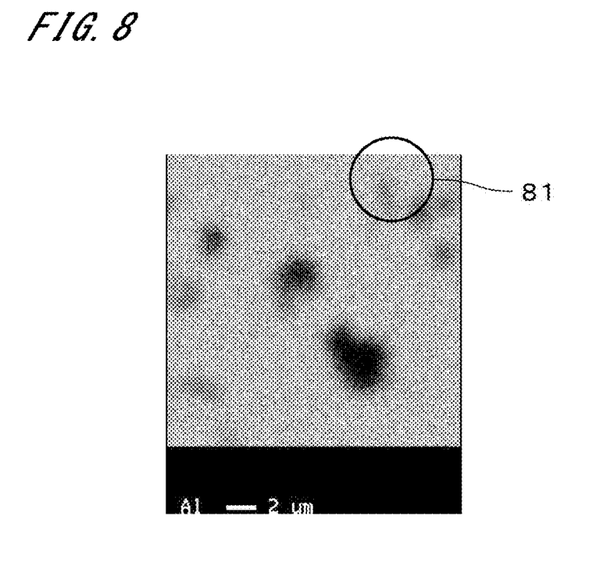
FIG. 8 is a view showing a result of performing an elemental mapping on the composite sintered body.
Figure 9:
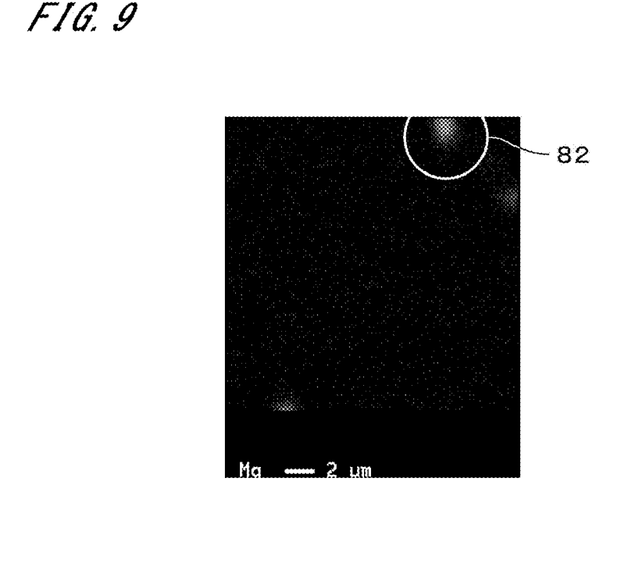
FIG. 9 is a view showing a result of performing an elemental mapping on the composite sintered body.
Figure 10:
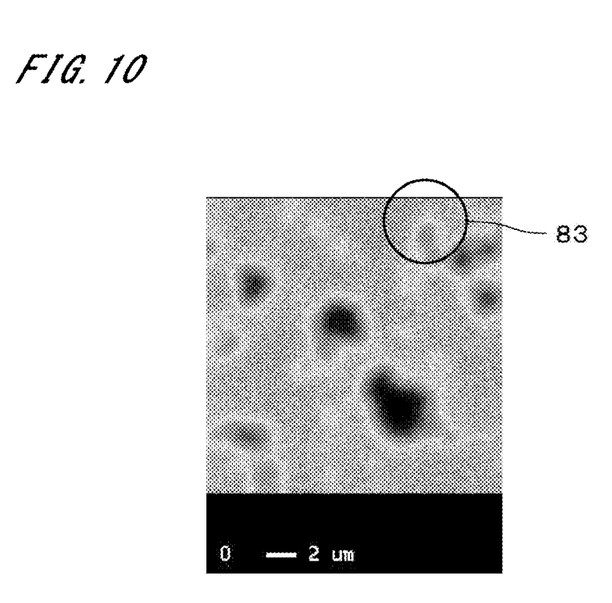
FIG. 10 is a view showing a result of performing an elemental mapping on the composite sintered body.

FIGS. 8 to 10 show images of EPMA elemental mapping performed on the composite sintered body of Experimental Example 2 with a magnification of 3000 times. In FIG. 8, an area surrounded by a circle with reference sign 81 is an area where Al exists, and in FIG. 9, an area surrounded by a circle with reference sign 82 is an area where Mg exists. Further, in FIG. 10, an area surrounded by a circle with reference sign 83 is an area where O (oxygen) Mg exists. Therefore, in an overlapping area of the areas 81, 82, and 83, the Mg—Al composite oxide exists.

Furthermore, the EPMA elemental mapping image is colored in accordance with the density into red, orange, yellow, yellow-green, green, blue, or indigo, and red represents the highest density and indigo represents the lowest density, and black represents zero. Since FIGS. 8 to 10 are shown in monochrome, however, original colors in FIGS. 8 to 10 will be described below. In FIG. 8 showing the Al area, the ground color is yellow and the island-shaped portion is colored in green to blue. In FIG. 9 showing the Mg area, the ground color is indigo and the point-like portion is colored in blue. In FIG. 10 showing the O area, the ground color is orange and the island-shaped portion is colored in green to blue.

As described above, the above-described composite sintered body includes $Al_2O_3$, SiC, and the Mg—Al composite oxide having a spinel-type crystal structure. The SiC includes β-SiC. As to the particle diameter of SiC in the composite sintered body, D50 is not smaller than 0.7 μm. The ratio of C in SiC to the composite sintered body is not lower than 1.0 weight percentage and not higher than 4.0 weight percentage. The Mg—Al composite oxide having a spinel-type crystal structure is thereby dispersedly arranged in a grain boundary of $Al_2O_3$ with high uniformity, and as a result, it is possible to suppress the abnormal grain growth of $Al_2O_3$. Further, it is possible to provide a composite sintered body having high relative dielectric constant and withstand voltage, and low tan δ.

Specifically, the relative dielectric constant at a frequency of 40 Hz and at a frequency of 1 MHz is preferably not lower than 12. It is thereby possible to increase the insulation of the composite sintered body. Further, in the case where the composite sintered body is used for the electrostatic chuck 1, it is possible to increase the adsorption force for the substrate 9. The relative dielectric constant is more preferably not lower than 13, and further preferably not lower than 14. Furthermore, more preferably, the relative dielectric constant in a range of frequency not lower than 40 Hz and not higher than 1 MHz is not lower than 12 (further preferably not lower than 13, and still more preferably not lower than 14).

Further, the withstand voltage of the composite sintered body is preferably not lower than 25 kV/mm. It is thereby possible to suitably prevent or suppress the dielectric breakdown of the composite sintered body. The withstand voltage is more preferably not lower than 30 kV/mm, and further preferably not lower than 50 kV/mm.

The tan δ of the composite sintered body at a frequency of 40 Hz and at a frequency of 1 MHz is preferably not higher than $1.0 \times 10^{-2}$. It is thereby possible to suitably suppress the dielectric loss of the composite sintered body in the application of an alternating current and suppress an increase in the temperature of the composite sintered body. The tan δ is more preferably not higher than $5.0 \times 10^{-3}$, and further preferably not higher than $3.0 \times 10^{-3}$. Further, more preferably, the tan δ in a range of frequency not lower than 40 Hz and not higher than 1 MHz is not higher than $1.0 \times 10^{-2}$ (further preferably not higher than $5.0 \times 10^{-3}$, and still more preferably not higher than $3.0 \times 10^{-3}$). Furthermore, the value of tan δ tends to depend on the frequency, and the value of tan δ tends to become lower as the measurement frequency becomes lower even in the measurement using the same sample.

The volume resistivity of the composite sintered body at a temperature of 25° C. is preferably not lower than $1.0 \times 10^{15}$ Ω·cm. It is thereby possible to prevent or suppress leakage of a current through the composite sintered body. The volume resistivity is more preferably not lower than $5.0 \times 10^{15}$ Ω·cm, and further preferably not lower than $1.0 \times 10^{16}$ Ω·cm.

The closed porosity of the composite sintered body is preferably not higher than 1.0%. It is thereby possible to prevent or suppress the leakage of a current through the composite sintered body. The closed porosity is more preferably not higher than 0.7%, and further preferably not higher than 0.5%.

The four-point bending strength of the composite sintered body is preferably not lower than 450 MPa. It is thereby possible to suitably prevent or suppress breakage of the composite sintered body. The four-point bending strength is more preferably not lower than 470 MPa, and further preferably not lower than 490 MPa.

In the composite sintered body, as to the particle diameter of SiC, preferably, D10 is not smaller than 0.3 μm. Further, it is preferable that D90 should not be smaller than 1.5 μm. Thus, since the particle diameter of SiC in the composite sintered body is relatively large, it is possible to suppress fall-off due to corrosion of SiC. As a result, it is possible to suppress coarsening of the surface of the composite sintered body. Furthermore, since the SiC particles can be suppressed to become a conductive path, it is possible to increase the withstand voltage.

As described above, in the composite sintered body, it is preferable that the content percentage of β-SiC in SiC should be larger than 50%. It is thereby possible to further reduce the tan δ of the composite sintered body. More preferably, the content percentage of β-SiC in SiC is substantially 100%. In other words, the crystal type of SiC is β type. It is thereby possible to further reduce the tan δ of the composite sintered body.

As to the sintered particle diameter of $Al_2O_3$ after Step S12, the average particle diameter is not smaller than 2 μm. Thus, since the particle diameter of $Al_2O_3$ in the composite sintered body is relatively large, it is possible to suppress desorption of $Al_2O_3$ particles from the composite sintered body and suppress generation of undesired particles.

In the composite sintered body, by including the Mg—Al composite oxide having a spinel-type crystal structure, it is possible to prevent or suppress an increase in the sintering temperature and the abnormal grain growth of $Al_2O_3$ due to the inclusion of SiC. As a result, it is possible to increase the denseness of the composite sintered body and the uniformity of the particle diameter distribution and increase the yield in the manufacture of the composite sintered body. As an index of the denseness, it is preferable that the open porosity of the composite sintered body should be not higher than 0.1%. Further, in the composite sintered body, by keeping the ratio of Mg in the Mg—Al composite oxide to the composite sintered body not lower than 0.015 weight percentage and not higher than 0.5 weight percentage, it is possible to further suitably prevent or suppress the abnormal grain growth of the $Al_2O_3$.

As described above, since the composite sintered body has high relative dielectric constant and withstand voltage and low tan δ, the composite sintered body is suitable for the semiconductor manufacturing apparatus member to be used in the semiconductor manufacturing apparatus. The composite sintered body is especially suitable for a semiconductor manufacturing apparatus member to be used in a high-power semiconductor manufacturing apparatus such as a high-power etching apparatus or the like. As a preferable example of the semiconductor manufacturing apparatus member formed by using the composite sintered body, the above-described electrostatic chuck 1 may be adopted. As described above, the electrostatic chuck 1 includes the chuck body 23 formed by using a composite sintered body and the internal electrode 24 disposed inside the chuck body 23.

The electrostatic chuck 1 can hold the substrate 9 by suitable adsorption in the semiconductor manufacturing apparatus. Further, as described above, since the respective particle diameters of $Al_2O_3$ and SiC are relatively large, it is possible to prevent or suppress fall-off due to corrosion of SiC. As a result, it is possible to suppress coarsening of the surface of the chuck body 23. Furthermore, it is possible to suppress desorption of the $Al_2O_3$ particles from the chuck body 23 at the adsorption of the substrate 9 or the like and suppress generation of undesired particles.

As described above, the method of manufacturing a composite sintered body includes a step (Step S11) of molding mixed powder in which $Al_2O_3$, SiC, and MgO are mixed, into a green body having a predetermined shape and a step (Step S12) of generating a composite sintered body by sintering the green body. Then, the SiC includes β-SiC. In Step S11, the ratio of SiC to the mixed powder is not lower than 4.0 weight percentage and not higher than 13.0 weight percentage. Further, the purity of $Al_2O_3$ in Step S11 is not lower than 99.9%. The Mg—Al composite oxide having a spinel-type crystal structure is thereby dispersedly arranged in a grain boundary of $Al_2O_3$ with high uniformity, and as a result, it is possible to suppress the abnormal grain growth of $Al_2O_3$. Further, it is possible to suitably manufacture a composite sintered body having high relative dielectric constant and withstand voltage, and low tan δ.

Furthermore, in Step S11, the ratio of MgO to the mixed powder is not lower than 0.05 weight percentage and not higher than 1.0 weight percentage. It is thereby possible to suitably prevent or suppress an increase in the sintering temperature and the abnormal grain growth of $Al_2O_3$ due to the inclusion of SiC.

As described above, as to the particle diameter (i.e., the raw material particle diameter) of SiC in Step S11, D10 is not smaller than 0.3 μm, D50 is not smaller than 1 μm, and D90 is not smaller than 2 μm. It is thereby possible to suitably manufacture the above-described composite sintered body in which the particle diameter of SiC is relatively large.

<Variations>

In the composite sintered body, the semiconductor manufacturing apparatus member, and the method of manufacturing the composite sintered body which are described above, various modifications can be made.

In the composite sintered body, for example, the ratio of Mg in the Mg—Al composite oxide to the composite sintered body may be lower than 0.01 weight percentage or may be higher than 1.0 weight percentage. Further, the open porosity of the composite sintered body may be higher than 0.1%, and the closed porosity may be higher than 1.0%. The withstand voltage of the composite sintered body may be lower than 25 kV/mm. The tan δ of the composite sintered body in a range of frequency not lower than 40 Hz and not higher than 1 MHz may be higher than $1.0 \times 10^{-2}$. The relative dielectric constant of the composite sintered body in a range of frequency not lower than 40 Hz and not higher than 1 MHz may be lower than 12. The volume resistivity of the composite sintered body at a temperature of 25° C. may be lower than $1.0 \times 10^{15}$ Ω·cm. The four-point bending strength of the composite sintered body may be lower than 450 MPa.

In the composite sintered body, as the particle diameter of the SiC particles dispersed in $Al_2O_3$, D10 may be smaller than 0.3 μm, and D90 may be smaller than 1.5 μm. As to the sintered particle diameter of $Al_2O_3$, the average particle diameter may be smaller than 2 μm.

In the manufacture of the composite sintered body, the ratio of MgO to the mixed powder in Step S11 may be lower than 0.025 weight percentage or may be higher than 1.0 weight percentage. As to the particle diameter of SiC (i.e., the raw material particle diameter) in Step S11, D10 may be smaller than 0.3 μm. Further, D50 may be smaller than 1 μm, or D90 may be smaller than 2 μm.

The maximum sintering temperature in Step S12 may be lower than 1650° C., or may be higher than 1725° C. In Step S12, the composite sintered body may be generated by any one of various sintering methods other than the hot-press method.

The composite sintered body may be used for manufacturing various semiconductor manufacturing apparatus members other than the electrostatic chuck 1. For example, the composite sintered body may be used for manufacturing a susceptor to be used to apply high frequency to the substrate 9. Further, a member to be used in an apparatus other than the semiconductor manufacturing apparatus may be formed by using the composite sintered body. For example, the composite sintered body may be used for manufacturing a ceramic heater for heating an object.

The configurations in the above-discussed preferred embodiment and variations may be combined as appropriate only if those do not conflict with one another.

INDUSTRIAL APPLICABILITY

The present invention can be used for a field relating to a semiconductor manufacturing apparatus, for example, for manufacturing an electrostatic chuck which holds a semiconductor substrate by adsorption using the Coulomb force or the Johnsen-Rahbek force.

REFERENCE SIGNS LIST

1 Electrostatic chuck
9 Semiconductor substrate
23 Chuck body
24 Internal electrode
S11 to S12 Step

The invention claimed is:
1. A composite sintered body, comprising:
aluminum oxide;
silicon carbide; and
magnesium-aluminum composite oxide having a spinel-type crystal structure,
wherein said silicon carbide includes β-type silicon carbide,
as to the particle diameter of said silicon carbide, D50 is not smaller than 0.7 μm, and
the ratio of carbon in said silicon carbide to said composite sintered body is not lower than 1.0 weight percentage and not higher than 4.0 weight percentage.

2. The composite sintered body according to claim 1, wherein
the ratio of magnesium in said magnesium-aluminum composite oxide to said composite sintered body is not lower than 0.01 weight percentage and not higher than 1.0 weight percentage.

3. The composite sintered body according to claim 1, wherein
the closed porosity thereof is not higher than 1.0%.

4. The composite sintered body according to claim 1, wherein
as to the particle diameter of said silicon carbide, D10 is not smaller than 0.3 μm.

5. The composite sintered body according to claim 1, wherein
as to the particle diameter of said silicon carbide, D90 is not smaller than 1.5 μm.

6. The composite sintered body according to claim 1, wherein
the percentage of β-type silicon carbide contained in said silicon carbide is higher than 50%.

7. The composite sintered body according to claim 1, wherein
as to the sintered particle diameter of said aluminum oxide, the average particle diameter is not smaller than 2 μm.

8. The composite sintered body according to claim 1, wherein
the withstand voltage thereof is not lower than 25 kV/mm.

9. The composite sintered body according to claim 1, wherein
the dielectric loss tangent thereof at a frequency of 40 Hz and at a frequency of 1 MHz is not higher than $1.0 \times 10^{-2}$.

10. The composite sintered body according to claim 1, wherein
the relative dielectric constant thereof at a frequency of 40 Hz and at a frequency of 1 MHz is not lower than 12.

11. The composite sintered body according to claim 1, wherein
the volume resistivity thereof at a temperature of 25° C. is not lower than $1.0 \times 10^{15}$ Ω·cm.

12. The composite sintered body according to claim 1, wherein
the four-point bending strength thereof is not lower than 450 MPa.

13. The composite sintered body according to claim 1, wherein
the open porosity thereof is not higher than 0.1%.

14. A semiconductor manufacturing apparatus member used in a semiconductor manufacturing apparatus, being formed by using said composite sintered body according to claim 1.

15. The semiconductor manufacturing apparatus member according to claim 14, being an electrostatic chuck comprising:
a chuck body produced by using said composite sintered body; and
an internal electrode arranged inside said chuck body.

16. A method of manufacturing a composite sintered body, comprising:
a) molding mixed powder in which aluminum oxide, silicon carbide, and magnesium oxide are mixed, into a green body having a predetermined shape; and
b) generating a composite sintered body by sintering said green body, wherein said silicon carbide includes β-type silicon carbide, the ratio of said silicon carbide in said mixed powder is not lower than 4.0 weight percentage and not higher than 13.0 weight percentage in said operation a), the purity of said aluminum oxide in said operation a) is not lower than 99.9%, and said composite sintered body comprises a magnesium-aluminum composite oxide having a spinel-type crystal structure.

17. The method of manufacturing a composite sintered body according to claim 16, wherein
the ratio of said magnesium oxide in said mixed powder is not lower than 0.05 weight percentage and not higher than 1.0 weight percentage in said operation a).

18. The method of manufacturing a composite sintered body according to claim 16, wherein
as to the raw material particle diameter of said silicon carbide in said operation a), D10 is not smaller than 0.3 μm, D50 is not smaller than 1 μm, and D90 is not smaller than 2 μm.

19. The method of manufacturing a composite sintered body according to claim 16, wherein
as to the sintered particle diameter of said aluminum oxide after said operation b), the average particle diameter is not smaller than 2 μm.

* * * * *